Oct. 9, 1962

E. J. POLLEY 3,058,075

TURRET TUNER WITH FINE TUNING CONTROL

Filed Feb. 15, 1961

2 Sheets-Sheet 1

INVENTOR

Eugene J. Polley

BY Cornelius J. O'Connor

ATTORNEY

Oct. 9, 1962 E. J. POLLEY 3,058,075

TURRET TUNER WITH FINE TUNING CONTROL

Filed Feb. 15, 1961 2 Sheets-Sheet 2

INVENTOR
Eugene J. Polley
BY Cornelius J. O'Connor
ATTORNEY

United States Patent Office 3,058,075

Patented Oct. 9, 1962

3,058,075

TURRET TUNER WITH FINE TUNING CONTROL

Eugene J. Polley, Lombard, Ill., assignor to Zenith Radio Corporation, a corporation of Delaware Filed Feb. 15, 1961, Ser. No. 89,422
6 Claims. (Cl. 334—51)

This invention relates in general to wave signal tuners and is particularly directed to an improvement in fine tuning for the channel selector arrangement of a television receiver.

Channel selection in television receivers usually involves a manually adjustable selector which brings into the circuitry of the receiver both a selector for the input of the receiver and a frequency-determining circuit for the heterodyne or local oscillator to yield a signal of the optimum intermediate frequency through the usual heterodyning process. It has been conventional practice in the past to provide a pair of adjustments in the channel selector, usually in the circuit of the local oscillator. One of these adjustments is set at the factory and the other, customarily referred to as a vernier or fine tuning control, may be adjusted in the viewer's location to optimize the response of the receiver. This is generally true both for the case of band switch tuning arrangements and the turret type tuner; obviously, it is very desirable to arrange for optimized adjustment of station selection with a single as distinguished from a pair of oscillator adjustments.

One approach to this desired objective is described and claimed in copending application Serial No. 28,105, filed May 10, 1960, now Patent No. 3,016,505, in the name of George C. Collins and assigned to the same assignee as the present invention. The arrangement there illustrated is a turret tuner in which the oscillator coil of each individual tuning strip is slug tuned and the tuning slug is retained within a threaded bushing provided with stop abutments for arresting axial displacement of the slug. The slug projects beyond the end of the tuning strip in order to accommodate a tool which engages the end of the tuning slug to permit its adjustment. Since the position of the slug should remain fixed at the completion of an adjustment to prevent detuning upon disengagement of the tool, a positive retention between the slug and its bushing must be provided. This in turn dictates a support of special construction. The Collins fine tuning arrangement is a feasible expedient for dispensing with one of the pair of adjustments previously adverted to as characteristic of prior art tuners. However, the fine tuning arrangement herein considered, especially the provision for rotatably supporting the tuning slug, constitutes a distinct improvement thereover.

It is therefore a general object of the invention to provide an improved fine tuning arrangement for the station selector of a wave signal receiver.

A specific object of the invention is the provision of a new and improved mounting arrangement for the tuning elements of tuning strips employed in a turret type television channel selector.

It is also an important object of the invention to provide a simple and inexpensive mounting arrangement for adjustably supporting the tuning element of a tunable circuit in a wave signal receiver.

A fine tuning arrangement, in accordance with the invention and employed for a wave signal receiver of the type having a tuning control driver movable in a given direction from an inoperative position into coupling engagement with the tuning element, comprises a frequency selector which includes an adjustable tuning element having a threaded portion terminating in a driven portion engageable by the tuning control driver. Means are provided for supporting the tuning element with the driven portion thereof disposed in the path of movement of the tuning control driver. This means comprises a housing having a passageway for guiding the tuning element into operative relation with the selector and a resilient clamp which exerts a force in the aforementioned given direction in order to hold the tuning element against the wall of the passageway. The clamp yieldably engages the threaded portion of the tuning element to effect longitudinal displacement of the element in response to rotation of the element by the tuning control driver. Preferably, there is provided a stop abutment for limiting the displacement of the tuning element toward the frequency selector.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figures 1, 2:
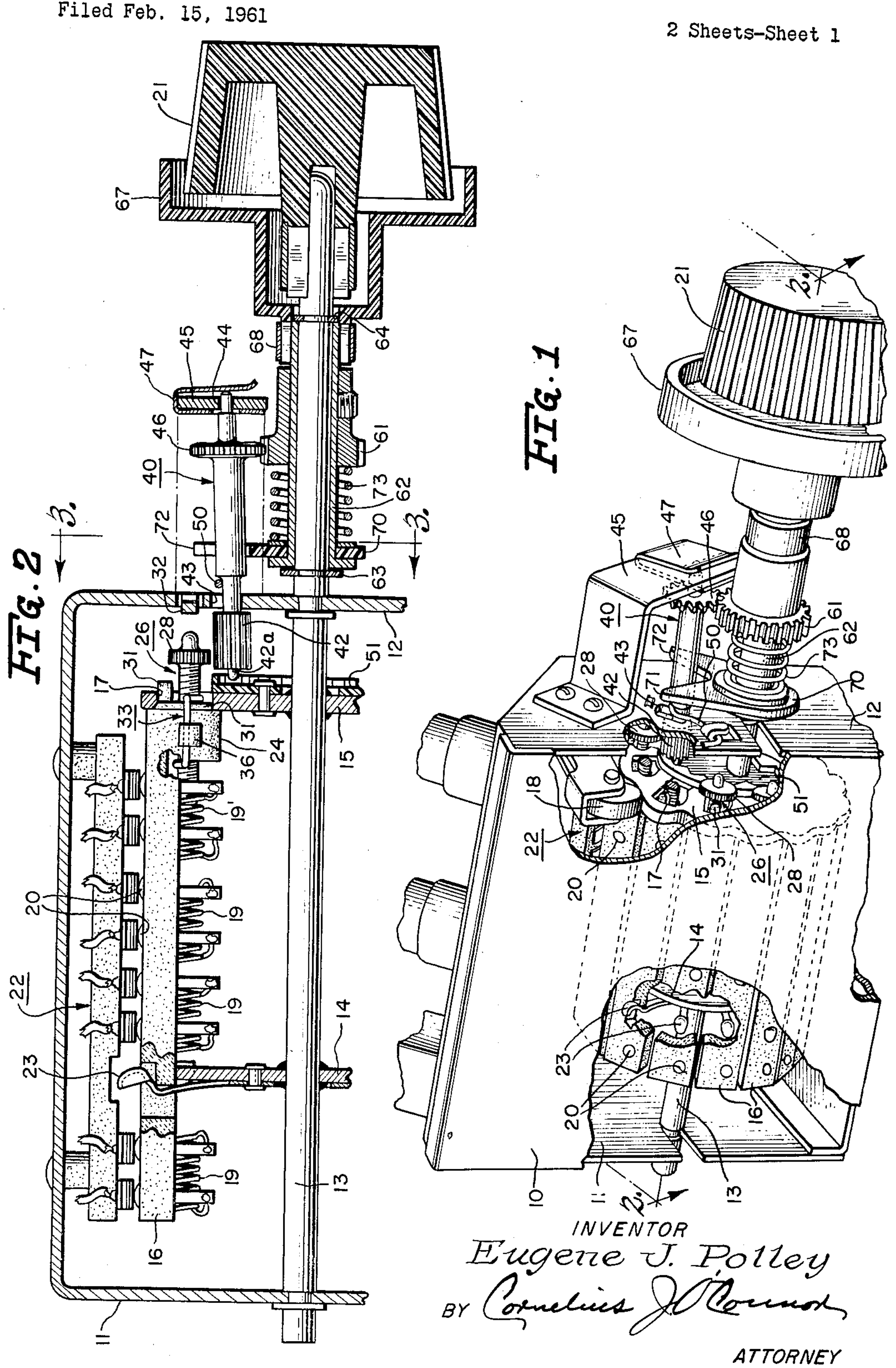
FIGURE 1 is a perspective view, partly broken away, of a turret type tuner embodying the subject invention.
FIGURE 2 is a sectional view taken generally along section lines 2—2 of FIGURE 1.

It is of course understood that the disclosed tuner constitutes what is normally referred to as the front end of a television receiver including the input selector to which the antenna is connected, the local oscillator and the first detector or heterodyne stage wherein a received signal is converted into a signal of appropriate intermediate frequency for translation through the remainder of the television receiver. One or more stages of radio frequency amplification may also be employed, if desired, being interposed between the antenna input and the first detector. The usual function of the channel selector, be it of the band switch or turret type, is to modify the circuitry of the front end so that it is highly selective to a desired station frequency. Considering more particularly the function of the turret tuner illustrated in the drawing, in any of its many operating conditions it introduces an RF selector at the antenna input, an appropriate reactance or tuning circuit for the local oscillator and an appropriate input reactance for the first detector so related to one another in respect of their individual frequency response or tuning as to achieve optimum conditions for the selection of a desired television channel. Both the circuitry of such a turret tuner and its principles of operation are well known in the art; for example, they are set forth in Patent 2,596,117 issued on May 13, 1952 to John F. Bell et al. and assigned to the same assignee as the present invention. Accordingly, this circuitry has not been shown in the annexed drawings, nor will it be discussed in detail further.

Referring now more particularly to FIGURE 1, the arrangement there represented is a turret type tuner for controlling the tuning of a television receiver with which the turret is operationally connected but, as indicated above, the associated circuitry of the receiver has been omitted for the purpose of simplicity. The turret has an enclosing shield container having end walls 11 and 12 and a side panel 10. Vacuum tubes, indicated by the usual symbols, are mounted on another panel which does not show in the view of FIGURE 1. The end plates 11 and 12 are slotted to receive and rotatably support a shaft 13 of a turret having a pair of end members 14 and 15. A plurality of tuning strips 16 are supported by these end members to define in conjunction therewith a well-known form of turret tuning device.

End member 14 may conveniently take the form of a spider constructed of a number of resilient radially extending arms 23. There is one such arm for each tuning strip and each strip has an aperture through which the arm projects as the strip is positioned in place and supported by end members 14 and 15. Generally, each section of the spider has a seat upon which the tuning strip rests, see FIGURE 2, and a clamping portion for overlapping the strip to hold it in place on the seat.

Figures 3, 4, 5, 6:
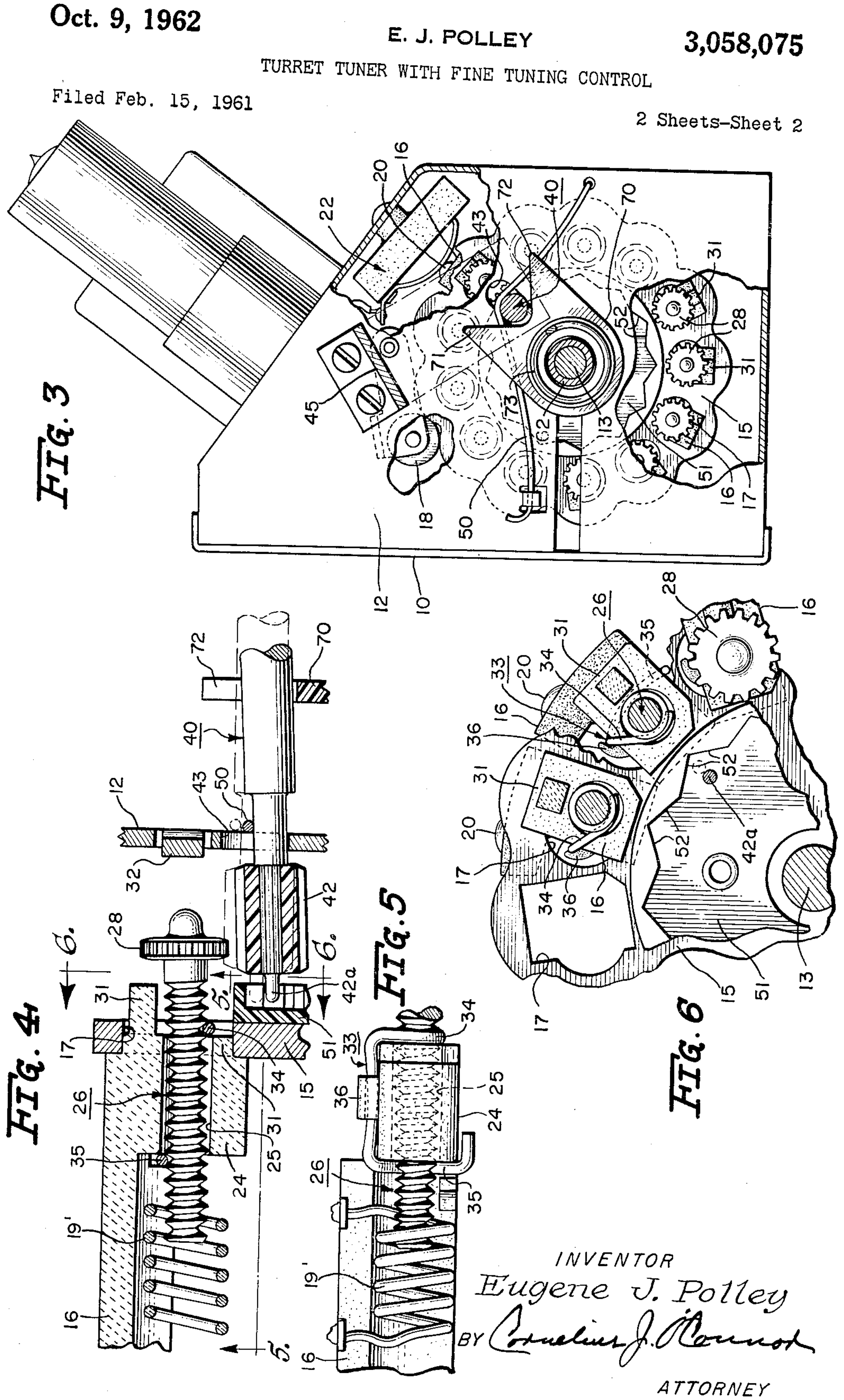
FIGURE 3 is an end view, partly broken away, taken along section lines 3—3 of FIGURE 2.
FIGURE 4 represents a detail of the tuning mechanism of FIGURE 2 during a fine tuning adjustment.
FIGURE 5 is a fragmentary bottom view of the tuning strip shown in FIGURE 4 taken along lines 5—5 of that figure.
FIGURE 6 is a fragmentary end view taken along lines 6—6 of FIGURE 4.

The end member 15 of the turret has a series of apertures 17, see FIGURE 6, corresponding in number to the maximum number of tuning strips to be accommodated by the turret. Each of strips 16 has a configuration at one end, including a shoulder 31 which is complementary to that of aperture 17 for insertion therein in order to support the strip upon end member 15. The peripheral edge of member 15 is scalloped to provide a series of indentations which cooperate with a detent roller 18 journalled upon a spring biased detent lever. The engagement of the detent roller with the periphery of member 15 affords positive indexing of the turret assembly.

The turret has a plurality of operating conditions or positions to which it may be adjusted by manipulation of a channel selector knob 21 affixed to one end of shaft 13. Each such position is established by the seating of detent 18 within an indentation of member 15 and in each such position one of the family of tuning strips is presented to the stationary contact bank 22 indicated in FIGURE 2. This bank of contacts represents the circuit connections of the receiver front end to which a tuning strip is to be connected in order to associate that strip functionally or operatively with the receiver circuits. Each strip carries the necessary circuit components, indicated as coils 19, 19′ in FIGURE 2, for tuning the receiver to a single selected station or channel. Each of the circuit components on the strip is conductively connected with contacts 20 carried on the face of the strip and presented to stationary contact bank 22 when that particular strip is to be operative. The engagement of these contacts completes the circuit connections necessary to place the strip in functional or operative relation with the receiver front end.

It is the adjustment of one or more of these components of the individual tuning strip that is involved in vernier or fine tuning of the receiver and experience has shown that it is sufficient to operate upon a single frequency selector of the strip, where the expression "frequency selector" is used to mean an impedance which may be adjusted to determine the dominant frequency response or characteristic of the strip. With the strip as represented in FIGURE 2, fine tuning is accomplished by adjusting the apparent inductance of coil 19′ comprising the principal tuning inductance of the local oscillator.

Inductor 19′ has a displaceable tuning element in the form of a tuning slug which is effective to modify the inductance of the coil depending upon the extent to which the slug extends within the coil turns. The slug is designated 26 and is displaceable in the axial direction of coil 19′. Its displacement is accomplished by rotating the slug which has a threaded shank and a driven portion, shown as a gear 28, to be engaged by a rotatable tuning control driver. The tuning control driver is movable in a given direction, specifically it moves generally upward, from an inoperative or rest position into coupling engagement with gear 28. This is assured by having the slug project beyond panel 15 of the turret with its head termination in the path of movement of the driver. At the same time gear 28 is proportioned to engage shoulder 31 of the strip as a stop abutment to limit inward displacement of the slug. Another stop abutment 32, struck out of panel 12 of the shield enclosure, is located in axial alignment with the slug to limit its outward displacement. Obviously, the apertures 17 of end plate 15 are dimensioned to permit gear termination 28 of the tuning slug to pass therethrough.

The mounting of the tuning slug on the strip, to which the present invention is particularly directed, is shown with particularity in FIGURES 4 and 5. The end of the strip adjacent panel 15 supports a housing 24 which may be formed integrally with the strip and which is provided with a passageway 25 for guiding the tuning slug into operative relation with coil 19′. Projecting from one side of housing 24 is a portion 36 which defines with member 24 a channel facing upward to receive and support the bight portion of a generally U-shaped resilient clamp 33 having end or leg portions 34 and 35 disposed transversely and spaced at opposite ends of passageway 25 and yieldably engaging the threaded portion of tuning element 26. Preferably, clamp 33 is a piece of flexible wire having a diameter approximately equal to the separation of threads on the tuning slug. End portion 35 rests on the top of the slug between convolutions of its thread while end portion 34 engages the undersurface of the slug and rests between convolutions of its thread. As a result the slug is forced against the lower wall of passageway 25 at the end thereof adjacent coil 19′ while it is urged against the upper wall at the opposite end of the passageway. Since clamp 33 is held stationary by spanning housing 24, rotation of the slug causes it to be displaced axially of coil 19′ in a direction determined by its direction of rotation. Moreover, since clamp 33 is flexible, continued rotation of the slug after it has been displaced to abut either of stops 31 and 32 merely causes end portions 34, 35 to raise up and re-seat themselves in their respective threads. Consequently the continued rotation of the slug does not damage the thread nor does it cause binding of the slug itself.

The tool or tuning control driving member through which the tuning slug may be adjusted is designated 40. It is normally retained in a rest position but is movable upwardly to an operative position in which it mechanically engages gear 28 of the tuning element on the turret strip which happens, at that time, to be instantaneously effective in controlling the tuning of the receiver. More specifically, tool 40 is an elongated device disposed in a slightly canted position relative to the axis of coil 19′ and having a free end 42, including a reduced portion **42*a*, adjacent member 15 and gear 28 of the tuning slug. It has provisions at that end to engage gear 28 of the tuning slug to establish a mechanical connection therebetween through which fine tuning adjustments may be made. Where the driven portion 28 of the slug is in the form of a gear, as indicated, terminal portion 42** of the tool constitutes a mating gear. Of course, other complementary configurations may be employed for these elements to achieve a suitable mechanical interconnection particularly since the load represented by the tuning slug is indeed very small.

Toward its other end, tool 40 carries a gear 46 through which it may conveniently be rotated. The end 42 of the tool protrudes through an aperture 43 of shield panel 12 while the opposite end is pivotally retained by a spring clip 47 in an aperture 44 formed in an L-shaped bracket 45 affixed to shield panel 12. Being pivotally supported, the tool may be advanced toward the tuning slug and retracted therefrom with ease. A return spring in the form of a wire 50 overlying the shank of tool 40 is secured to shield panel 12 and serves normally to retain tool 40 in its rest position out of engagement with the tuning slug.

An actuating mechanism is provided for tool 40. It comprises a fine tuning knob 67 and means responsive to rotation thereof for displacing tool 40 to its operative position and for concurrently rotating the tool in order to accomplish fine tuning. More particularly, the actuating mechanism includes a driving gear 61 in continuous driving engagement with gear 46 of tool 40. Gear 61 is secured through a set screw to a bushing 62 journalled upon turret shaft 13 for rotation with respect thereto and is maintained in position along the shaft by washers 63 and 64.

There is also included in the actuating mechanism a cam 70 mounted on bushing 62 and captivated thereon by a slip-friction clutch comprising the flanged end of bushing 62 and a coil spring 73. The cam has a pair of lobes 71, 72 defining a V-notch through which the shank of tool 40 passes. Cam lobes 71 and 72 displace tool 40 in an upward direction whenever cam 70 is rotated in either direction from the rest position of FIGURE 2. Concurrent actuation of drive gear 61 and cam 70 is accomplished by fine tuning knob 67 which is supported in nested concentric relation to station selector knob 21. The inner portion of knob 67 overlaps bushing 62 and is mechanically coupled thereto by means of a tension strap 68.

It is expected that spring 50 will return tool 40 to its rest position after manipulation of knob 64 has achieved fine tuning but this may not always be the case. If the tool should remain in its operative position after the fine tuning adjustment has been made, rotation of channel selector knob 21 to tune the receiver to another channel would damage the fine tuning arrangement. In order to avoid that possibility, decoupling means, responsive to adjustment of the station selector knob, are provided to insure disengagement of tool 40 from the tuning slug. More particularly, the decoupling means comprises a circular cam 51 riveted to end panel 15 of the turret and having a series of V-shaped cam elements 52, the nadirs of which lie in radial projections extending from the center of shaft 13 to each of the tuning strip slugs, see FIGURE 6. The radius of cam ring 51 is so chosen that cam elements 52 are movable along a path which intercepts the position assumed by the free end 42*a* of tool 40, when it is in its operative position shown in dotted construction in FIGURES 4 and 6. Additionally, the angle defined by the sides of the individual cam elements 52 is large enough that the cam elements may span the end 42*a* of tool 40 and permit free access of tool 40 to gear 28 of the tuning slug during fine tuning adjustments when the turret is stationary. The decoupling arrangement is claimed in copending application Serial No. 89,411, filed February 15, 1961 in the name of Norman J. Moran and assigned to the same assignee as the subject invention.

It will be understood that while fine tuning is not resorted to unless it is necessary, the described arrangement provides for convenient and accurate fine tuning adjustments. In order to tune the receiver, station selector knob 21 is rotated and the turret is moved in step-by-step fashion in clockwise or counter-clockwise direction at the election of the user. Such rotation of the turret presents the individual tuning strips sequentially to their operative position to the end that each strip is individually and sequentially brought into functional relation with the front end of the receiver. This selection process continues until the strip corresponding to the station that is desired has been brought to the operative position indicated in FIGURE 2. During this channel-selection process cam 70 and tool 40 are in their rest positions all as illustrated in FIGURE 2 and the fine tuning arrangement presents no interference to the rotation of the turret. If the instantly operative tuning strip 16 is sharply tuned, there is no occasion to adjust the fine tuning control but, should less than optimum image reproduction be attained, vernier tuning may be resorted to in an effort to improve reception.

To accomplish fine tuning knob 67 is rotated and it will be assumed initially that it is rotated in a clockwise direction. In response to rotation of the fine tuning knob, cam 70 is displaced in a clockwise direction by virtue of the clutch action of coil spring 73. Cam lobe 71 engages the shank of tool 40 to deflect the tool vertically upwards to engage gears 28 and 42. This establishes a mechanical driving connection with the tuning slug of the turret strip and since clamp 33 holds the slug in a fixed position, the movement of tool 40 into its operative position does not, by itself, cause displacement of the tuning slug. Concurrently with the displacement of the tool into its operative position, driving gear 61 rotates the tool in a counter-clockwise direction to move the slug relative to the field of coil 19' and adjust the operating frequency of the local oscillator in one sense. Adjustment of the oscillator frequency in the opposite sense is occasioned by rotating vernier control knob 67 in a counter-clockwise direction. The adjustment of the slug is continued until optimum tuning is achieved.

Stop abutments 31, 32 define the limits of the range over which the tuning slug may be displaced. After either limit has been reached, continued rotation of fine tuning control 67 causes no difficulty since leg portions 34, 35 of clamp 33 yield and the slug rotates harmlessly without further advancement. In normal circumstances, spring 50 returns tool 40 to its rest position when the fine tuning is complete. The locking action of clamp 33 which holds the slug fast against movement in a direction transverse to its length assures that the tuning condition will be preserved when tool 40 is disengaged from the slug.

In the event gears 28 and 42 fail to disengage upon completion of a fine tuning operation, their positive disengagement is assured by virtue of cam sectors 52 which, in response to rotation of the turret in either direction, drive the tool radially inward, clear of the free ends of the array of tuning slugs.

The described fine tuning arrangement is of exceedingly simple construction and yet provides the positive driving action required to accomplish the tuning function. The support for the tuning slug, including clamp 33, holds the slug firmly and precludes detuning effects that would otherwise be encountered as tool 40 is presented to and disengaged from the slug.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fine tuning arrangement for a wave signal receiver of the type having a tuning control driver movable in a given direction from an inoperative position into coupling engagement with a tuning element, said arrangement comprising: a frequency selector including an adjustable tuning element having a threaded portion terminating in a driven portion to be engaged by said tuning control driver; and means for supporting said tuning element with said driven portion disposed in the path of movement of said tuning control driver; said supporting means comprising a housing having a passageway for guiding said tuning element into operative relation with said selector, a resilient clamp exerting a force in said direction to hold said element against a wall of said passageway and yieldably engaging said threaded portion of said tuning element to effect longitudinal displacement thereof in response to rotation of said element by said tuning control driver.

2. A fine tuning arrangement for a wave signal receiver of the type having a tuning control driver movable in a given direction from an inoperative position into coupling engagement with a tuning element, said arrangement comprising: a frequency selector including an adjustable tuning element having a threaded portion terminating in a driven portion to be engaged by said tuning control driver; means for supporting said tuning element with said driven portion disposed in the path of movement of said tuning control driver; said supporting means comprising a housing having a passageway for guiding said tuning element into operative relation with said selector, a resilient clamp exerting a force in said direction to hold said element against a wall of said passageway and yieldably engaging said threaded portion of said tuning element to effect longitudinal displacement thereof in response to rotation of said element by said tuning control driver; and a stop abutment for limiting the displacement of said element.

3. A fine tuning arrangement for a wave signal receiver of the type having a tuning control driver movable in a given direction from an inoperative position into coupling engagement with a tuning element, said arrangement comprising: a frequency selector including an adjustable tuning element having a threaded portion terminating in a driven portion to be engaged by said tuning control driver; means for supporting said tuning element with said driven portion disposed in the path of movement of said tuning control driver; said supporting means comprising a housing having a passageway for guiding said tuning element into operative relation with said selector, a resilient clamp having two transverse portions spaced at opposite ends of said passageway and yieldably engaging said threaded portion of said tuning element at opposite sides thereof, said transverse portions exerting a force in said given direction to hold said element against the wall of said passageway and effecting longitudinal displacement thereof in response to rotation of said element by said tuning control driver; and a stop abutment for limiting displacement of said element.

4. A fine tuning arrangement for a wave signal receiver of the type having a tuning control driver movable in a given direction from an inoperative position into coupling engagement with a tuning element, said arrangement comprising: a frequency selector including an adjustable tuning element having a threaded portion terminating in a driven portion to be engaged by said tuning control driver; means for supporting said tuning element with said driven portion disposed in the path of movement of said tuning control driver; said supporting means comprising a housing having a passageway for guiding said tuning element into operative relation with said selector, a U-shaped resilient clamp having a bight portion secured to said housing and a pair of leg portions spaced at opposite ends of said passageway and yieldably engaging said threaded portion of said tuning element at opposite sides thereof, said leg portions exerting a force in said given direction to hold said element against the wall of said passageway and effecting longitudinal displacement thereof in response to rotation of said element by said tuning control driver; and a stop abutment for limiting displacement of said element towards said selector.

5. A fine tuning arrangement for a wave signal receiver of the type having a tuning control driver movable in a given direction from an inoperative position into coupling engagement with a tuning element, said arrangement comprising: a frequency selector including an adjustable tuning element having a threaded portion terminating in a driven portion to be engaged by said tuning control driver; means for supporting said tuning element with said driven portion disposed in the path of movement of said tuning control driver; said supporting means comprising a housing having a passageway for guiding said tuning element into operative relation with said selector, a U-shaped resilient clamp formed of a wire having a diameter approximately equal to the separation of threads on said tuning element, having a bight portion secured to said housing and having a pair of leg portions spaced at opposite ends of said passageway and yieldably engaging said threaded portion of said tuning element at opposite sides thereof, said leg portions exerting a force in said given direction to hold said element against the wall of said passageway and effecting longitudinal displacement thereof in response to rotation of said element by said tuning control driver; and a stop abutment for limiting displacement of said element towards said selector.

6. A fine tuning arrangement for a wave signal receiver of the type having a tuning control driver movable upwardly from an inoperative position into coupling engagement with a tuning element, said arrangement comprising: a frequency selector including an adjustable tuning element having a threaded portion terminating in a driven portion to be engaged by said tuning control driver; means for supporting said tuning element with said driven portion disposed in the path of movement of said tuning control driver; said supporting means comprising a housing having a passageway for guiding said tuning element into operative relation with said selector and a channel facing upwardly, a U-shaped resilient clamp formed of a wire having a diameter approximately equal to the separation of threads on said tuning element, having a bight portion disposed in said channel and having a pair of leg portions spaced at opposite ends of said passageway and yieldably engaging said threaded portion of said tuning element, said leg adjacent said driven portion of said tuning element engaging the under side of said threaded portion, said other leg engaging the upper side of said threaded portion, said leg portions exerting an upward force on said driven portion of said tuning element to hold said element against transverse displacement and effecting longitudinal displacement thereof in response to rotation of said element by said tuning control driver; and a stop abutment for limiting displacement of said element towards said selector.

References Cited in the file of this patent

UNITED STATES PATENTS

| | | |
|---|---|---|
| 2,600,119 | Lazzery | June 10, 1952 |
| 2,981,838 | Poskozim | Apr. 25, 1961 |